US008405326B2

(12) United States Patent
Kolodney et al.

(10) Patent No.: US 8,405,326 B2
(45) Date of Patent: Mar. 26, 2013

(54) METHOD AND APPARATUS FOR GENERATING ION BEAM

(75) Inventors: Eli Kolodney, Haifa (IL); Anatoly Bekkerman, Haifa (IL); Boris Tsipinyuk, Nesher (IL); Yonatan Manor, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 796 days.

(21) Appl. No.: 12/087,673

(22) PCT Filed: Jan. 14, 2007

(86) PCT No.: PCT/IL2007/000051
§ 371 (c)(1),
(2), (4) Date: Jan. 6, 2009

(87) PCT Pub. No.: WO2007/080594
PCT Pub. Date: Jul. 19, 2007

(65) Prior Publication Data
US 2009/0200485 A1 Aug. 13, 2009

Related U.S. Application Data

(60) Provisional application No. 60/758,566, filed on Jan. 13, 2006.

(51) Int. Cl.
*H01J 23/00* (2006.01)
(52) U.S. Cl. ........................................................ 315/500
(58) Field of Classification Search .................. 315/500; 250/423 R, 424, 425, 427, 423 F
See application file for complete search history.

(56) References Cited

U.S. PATENT DOCUMENTS

| 4,318,029 A | * | 3/1982 | Jergenson | ............... 315/111.81 |
| 6,265,722 B1 | | 7/2001 | Marsh | |
| 6,281,025 B1 | * | 8/2001 | Ring et al. | ..................... 438/10 |
| 2005/0269559 A1 | | 12/2005 | Zhou et al. | |

FOREIGN PATENT DOCUMENTS

| DE | 3404626 | 9/1984 |
| GB | 2386747 | 9/2003 |
| JP | 60-028147 | 2/1985 |
| JP | 60-167249 | 8/1985 |
| WO | WO 2007/080594 | 7/2007 |

OTHER PUBLICATIONS

International Preliminary Report on Patentability Dated Jul. 24, 2008 From the International Bureau of WIPO Re.: Application No. PCT/IL2007/000051.

\* cited by examiner

*Primary Examiner* — Douglas W Owens
*Assistant Examiner* — Jianzi Chen

(57) ABSTRACT

A device for replenishing ionizable material in a field ionization apparatus is disclosed. The device comprises a heatable reservoir containing the ionizable material, a field ionization electrode structure, and a channel being in fluid communication with said heatable reservoir. The heatable reservoir and the channel are designed and constructed such that when the heatable reservoir is heated to an evaporation temperature of the ionizable material, a flux of vaporized ionizable material is directed along the channel to a tip of the field ionization electrode structure.

33 Claims, 13 Drawing Sheets

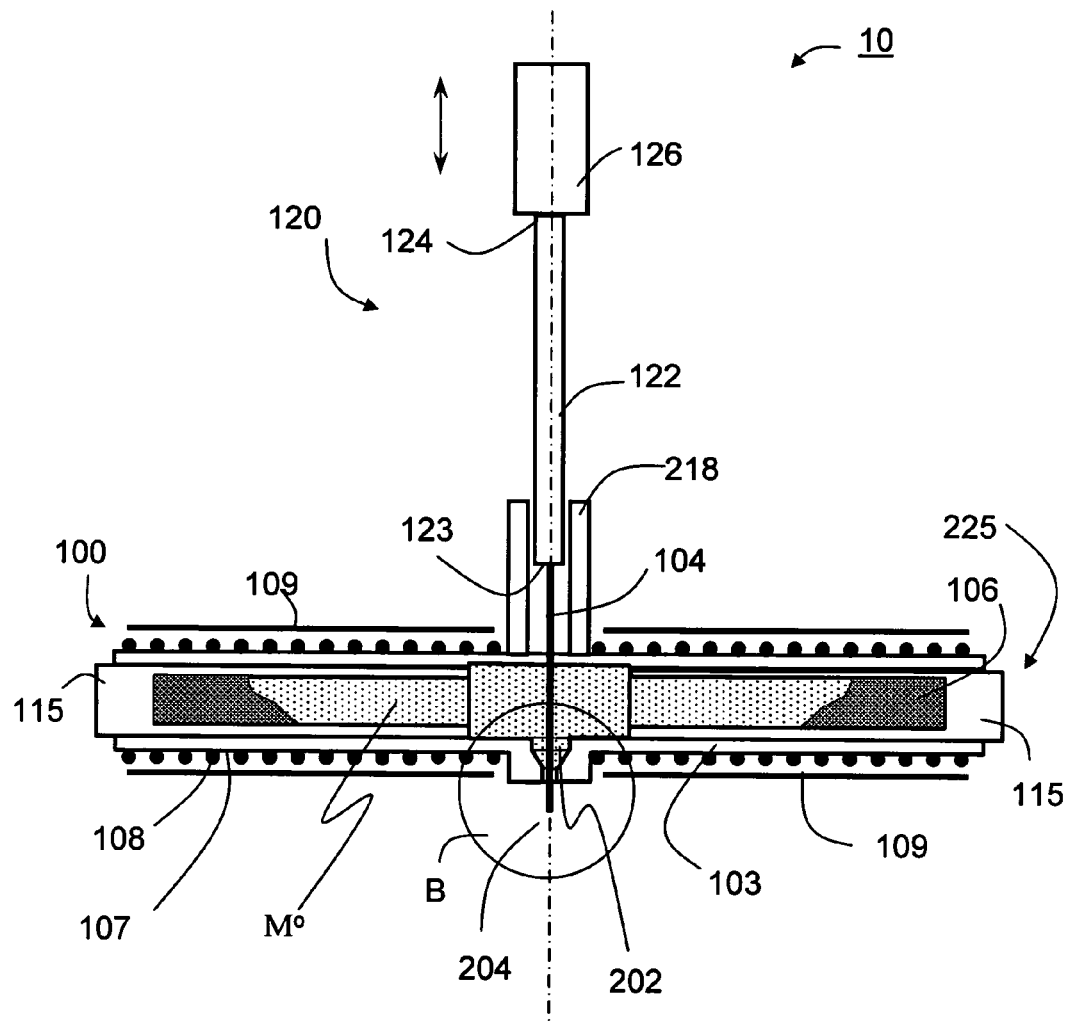
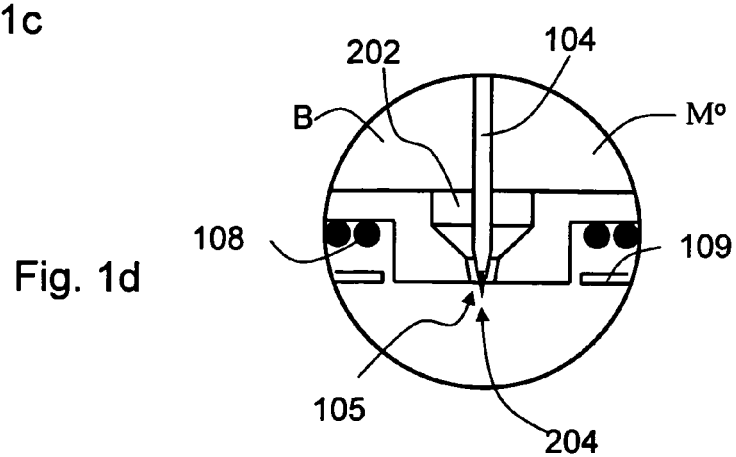
Fig. 1c
Fig. 1d

METHOD AND APPARATUS FOR GENERATING ION BEAM

RELATED APPLICATIONS

This application is a National Phase Application of PCT Application No. PCT/IL2007/000051 having International Filing Date of Jan. 14, 2007, which claims the benefit of U.S. Provisional Patent Application No. 60/758,566, filed on Jan. 13, 2006. The contents of the above Applications are all incorporated herein by reference.

FIELD AND BACKGROUND OF THE INVENTION

The present invention relates to ion sources, and more particularly, to a device, apparatus, system and method utilizing a field ionization phenomenon for the generation of positively charged ion beam.

The production of particle beams is of considerable importance in such diverse areas as atomic, molecular and plasma physics, thin film deposition, surface etching, ion implantation, submicron lithography, nano-electro-mechanical and nanophotonic system construction, new material synthesis, and electric propulsion devices. Applications utilizing anionic particulate beams find use in fundamental science areas, e.g., surface chemistry and catalysis, organic chemistry, and biology. For example, FAB (Fast Atom Bombardment) and TOF-SIMS (Time Of Flight Secondary Ion Mass Spectrometry) instruments are widely used for tailoring and analyzing new biomaterials and organic structures on the molecular level in the fields of pharmacology and biotechnology, and FIB (Focused Ion Beam) instruments are used for nano-processing and nano-patterning of solid surfaces.

It is recognized that modern processes employing particle beams require high current density, high brightness and high probe current. Such properties can be achieved, e.g., using ion guns employing a liquid metal ion source (LMIS). In one approach, a structure having a sharp tip is covered with a layer of liquid metal. Application of a negative high voltage to an extraction electrode in proximity to the tip brings about concentration of an electric field at the tip. When the voltage reaches a certain threshold value, the liquid metal located at the tip forms a conical cusp called Taylor Cone, leading to an extraction of ions from the tip. As the ions are emitted from the source, more liquid metal flows from a reservoir down the needle to the cusp to replenish the emitted material. Ions emitted from a LMIS-based ion gun can be focused in an extremely fine and very high density beam of a sub-micron diameter.

Another type of ion source is disclosed in U.S. Pat. Nos. 6,265,722 and 6,429,439. This type of source includes a needle, an extraction electrode disposed proximate to the tip of the needle and a voltage which maintains the tip at a high potential relative to the extraction electrode. A heated reservoir containing an organic ion source material contacts the needle such that the temperature of the organic ion source material is maintained at a magnitude sufficient to encourage capillary flow of the material from the reservoir along the needle. Such ion source, however, suffers from a severe limitation because, in practice, the applied heat to the reservoir is not sufficient to replenish the emitted material at the tip of the needle where ionization takes place.

Recently, fullerene-based ion guns have been developed. For example, International Patent Application, Publication No. WO2006/056975, the contents of which are hereby incorporated by reference, discloses apparatus in which fullerene molecules passing through a heated duct are negatively charged by a process of low-energy electron capture. The charged molecules are manipulated to an anionic beam by one or more electrodes.

Fullerenes, most notably $C_{60}$, are a newly discovered form of carbon. The fullerenes are a family of hollow (cage) all-carbon structures. $C_{60}$ is the most prominent member of this family. $C_{60}$ is a perfectly symmetrical molecule composed of 60 carbon atoms arranged on the surface of a sphere in an array of 12 pentagons and 20 hexagons (a soccer-ball molecule). $C_{60}$ has many unique properties but most relevant here are its structural rigidity (closed cage) and its thermal and collisional stability. Other relatively common fullerenes are $C_{70}$, $C_{76}$ and $C_{84}$. Their structure is described in "Science of fullerenes and carbon Nanotubes," M. S. Dresselhaus et al., Academic Press, San-Diego 1996, the contents of which are hereby incorporated by reference. Fullerene cages are approximately 7-15 Angstroms in diameter. The molecules are relatively stable; the molecules dissociate at temperatures above 1000° C. Fullerenes sublime at much lower temperatures, typically a few hundred degrees centigrade.

The use of energetic cluster or polyatomic ions as primary projectiles for static SIMS analysis of organic and inorganic samples and for depth profiling (dynamic SIMS) of such samples has many advantages compared to the traditionally used atomic ion collier. Polyatomic or cluster ions produce significantly higher yield of secondary ions (5-100 times) as compared to atomic ions. This yield enhancement relates to the fact that the deposited impact energy is distributed over a broader and shallower surface region than for an atomic species, and only the topmost layers of the substrate absorbs the impact energy. Therefore, the use of fullerene ion projectiles as the primary beam is attractive due to the relatively shallow penetration of the fullerene ion projectile into the bulk and the extremely high surface sensitivity of the adsorbed molecules analysis. Also, depth profiling of soft matter (e.g., organic, polymeric or biomaterial) is more probable due to reduced sub-surface damage and reduced interlayer mixing.

Various methods for the generation of fullerene ion beams are known. Representative examples include laser ablation and desorption of graphite or fullerene targets [MS Dresselhaus et al., "Science of Fullerenes and Carbon Nanotubes", Academic Press, San Diego, Calif., 1996; HD Busmann et al., "Surface Science", 272: 146, 1992], fission fragments impact on a $C_{60}$ coated surfaces [K Baudin et al., "A Spontaneous Desorption Source For Polyatomic Ion Production", Rapid Comm. in Mass Spect. 12 (13): 852-856, 1998], fullerene thermal desorption combined with electron attachment or electron impact ionization [T Jaffke et al., "Formation of $C_{60}^-$ and $C_{70}^-$ By Free Electron Capture. Activation Energy And Effect of the Internal Energy On Lifetime", Chem. Phys. Lett. 226: 213-218, 1994; SCC Wong et al. "Development Of A C-60(+) Ion Gun for Static SIMS and Chemical Imaging", Appl. Surf. Sci. 203: 219-222, 2003; D Weibel et al., "A C-60 Primary Ion Beam System For Time of Flight Secondary Ion Mass Spectrometry: Its Development and Secondary Ion Yield Characteristics", Anal. Chem. 75 (7): 1754-1764, 2003]. Attempts have also been made to use conventional ion sources (arc-discharge and sputtering type) [PD Horak et al., "Broad Fullerene-Ion Beam Generation and Bombardment Effects", Applied Physics Letters, 65 (8): 968-970, 1994; S Biri et al., "Production of Multiply Charged Fullerene and Carbon Cluster Beams by a 14.5 GHz ECR Ion Source", Review of Sci. Instr. 73(2): 881-883, 2002; C Sun et al., "Extraction of $C_{60}^-$ and Carbon Cluster Ion Beams from a Cs Sputtering Negative Ion Source", Fudan Univ., Shanghai, Peop. Rep. China. Hejishu 17(7): 407-410, 1994].

These methods have various drawbacks when used for submicron focused beam applications. Among these are the complexity of the source, the need for an additional mass filter due to fragmentation upon ionization, low current density and brightness, and large energy dispersion of emitted ions or poor focusing.

There is thus a widely recognized need for, and it would be highly advantageous to have an apparatus and method for the generation of a positively charged ion beam by field ionization, devoid the above limitations.

SUMMARY OF THE INVENTION

According to one aspect of the present invention there is provided a device for replenishing ionizable material in a field ionization apparatus. The device comprises a heatable reservoir containing the ionizable material, a field ionization electrode structure, and a channel being in fluid communication with the heatable reservoir. The heatable reservoir and the channel are designed and constructed such that when the heatable reservoir is heated to an evaporation temperature of the ionizable material, a flux of vaporized ionizable material is directed along the channel to a tip of the field ionization electrode structure.

According to another aspect of the present invention there is provided an apparatus for generating a positively charged ion beam by field ionization, comprises the device as described herein and an extraction electrode positioned in proximity to the tip. The extraction electrode is configured to generate at the tip electric field of sufficient intensity to ionize the vapors to generate the positively charged ion beam According to an additional aspect of the present invention there is provided a system for analyzing substances ejected from a surface of a sample bombarded with a positively charged ion beam. The system comprises the apparatus as described herein and a detector for detecting the substances once ejected of the surface.

According to further features in preferred embodiments of the invention described below, the device further comprises a mechanism for adjusting the position of the field ionization electrode structure within the channel.

According to still further features in the described preferred embodiments the mechanism comprises a rod having an inner end connected to the field ionization electrode structure and an outer end connected to a drive device.

According to still further features in the described preferred embodiments the heatable reservoir comprises an elongated chamber and a heating ribbon wound around the elongated chamber.

According to still further features in the described preferred embodiments the heating ribbon comprises at least one material selected from the group consisting of tungsten, molybdenum, rhenium, hafnium, tantalum and any alloy thereof.

According to still further features in the described preferred embodiments the heatable reservoir is made at least in part of a material characterized by chemical inertness up to a maximum service temperature of the heatable reservoir.

According to still further features in the described preferred embodiments the material characterized by the chemical inertness up to the maximum service temperature of the heatable reservoir is selected from the group consisting of a metal or a ceramic material.

According to still further features in the described preferred embodiments the device further comprises at least one shielding member configured for thermal isolation of the reservoir and the field ionization electrode structure.

According to still further features in the described preferred embodiments the device further comprises at least one ingress port connected to the heatable reservoir and configured for feeding of the heatable reservoir with ionizable material.

According to still further features in the described preferred embodiments the extraction electrode comprises a centered orifice being coaxial with a central axis of the field ionization electrode structure.

According to still further features in the described preferred embodiments the apparatus further comprises a tip heating mechanism configured for heating the tip.

According to still further features in the described preferred embodiments the tip heating mechanism is operable to heat the tip by resistive heating.

According to still further features in the described preferred embodiments the tip heating mechanism is operable to heat the tip by electron bombardment.

According to still further features in the described preferred embodiments the tip heating mechanism comprises a thermal electron emitter configured for emitting thermal electrons, and an additional electrode kept at an electrical potential which is lower than the electrical potentials of the extraction electrode and the tip such as to accelerate the thermal electrons in the direction of the tip.

According to still further features in the described preferred embodiments the apparatus further comprises an additional electrode kept at an electrical potential which is lower than the electrical potential of the extraction electrode.

According to still further features in the described preferred embodiments the apparatus further comprises at least one focusing element designed and configured for focusing the positively charged ion beam.

According to still further features in the described preferred embodiments the at least one focusing element comprises an Einzel lens.

According to still further features in the described preferred embodiments the apparatus further comprises at least one gate electrode for pulsed beam mode operation.

According to still further features in the described preferred embodiments the apparatus further comprises deflector plates for raster scanning the positively charged ion beam onto a surface.

According to still another aspect of the present invention there is provided a method of replenishing ionizable material in a field ionization apparatus, the method comprises: heating the ionizable material to an evaporation temperature of the ionizable material, and introducing vapors of the ionizable material into a channel so as to generate a flux of vaporized ionizable material directed along the channel to a tip of a field ionization electrode structure.

According to an additional aspect of the present invention there is provided a method of generating a positively charged ion beam by field ionization, comprises: heating the ionizable material to an evaporation temperature of the ionizable material; introducing vapors of the ionizable material into a channel so as to generate a flux of vaporized ionizable material directed along the channel to a tip of a field ionization electrode structure; and generating at the tip an electric field of sufficient intensity to ionize the vapors generating the positively charged ion beam.

According to yet an additional aspect of the present invention there is provided a method of analyzing substances ejected from a surface of a sample bombarded with a positively charged ion beam, comprises, executing the method of claim 23 so as to cause ejection of substances from the surface of the sample, detecting the ejected substances, and analyzing the ejected substances.

According to further features in preferred embodiments of the invention described below, the method further comprises adjusting the position of the field ionization electrode structure.

According to still further features in the described preferred embodiments the method further comprises heating the tip.

According to still further features in the described preferred embodiments the heating is by resistive heating.

According to still further features in the described preferred embodiments the heating is by electron bombardment.

According to still further features in the described preferred embodiments at least a part of the field ionization electrode structure is positioned within the channel.

According to still further features in the described preferred embodiments the channel comprises an orifice and the tip protrudes through the orifice.

According to still further features in the described preferred embodiments at least a part of the channel is shaped as a capillary and at least a part the field ionization electrode structure is substantially concentric with the capillary.

According to still further features in the described preferred embodiments the channel is defined between two substantially concentric conical frustums.

According to still further features in the described preferred embodiments the channel is defined between two substantially concentric cylinders.

According to still further features in the described preferred embodiments the channel is made at least in part of a ceramic material characterized by chemical inertness up to a maximum service temperature of the channel.

According to still further features in the described preferred embodiments the tip comprises at least one material selected from the group consisting of molybdenum, tungsten, rhenium, tantalum and diamond.

According to still further features in the described preferred embodiments the ionizable material is inorganic.

According to still further features in the described preferred embodiments the ionizable material is substantially dry.

According to still further features in the described preferred embodiments the ionizable material is in a powder form.

According to still further features in the described preferred embodiments the ionizable material comprises fullerene molecules.

According to still further features in the described preferred embodiments the ionizable material comprises substituted fullerene molecules.

According to still further features in the described preferred embodiments the ionizable material comprises molecules selected from the group consisting of $C_{60}$ molecules and $C_{70}$ molecules.

According to still further features in the described preferred embodiments the ionizable material comprises bromine molecules.

According to still further features in the described preferred embodiments the ionizable material comprises iodine molecules.

According to still further features in the described preferred embodiments the ionizable material comprises an aggregate of different molecules. According to still further features in the described preferred embodiments the ionizable material comprises a mixture of fullerenes.

According to still further features in the described preferred embodiments the ionizable material comprises a mixture of inorganic materials.

According to still further features in the described preferred embodiments the ionizable material comprises a mixture of organic materials.

According to still further features in the described preferred embodiments the ionizable material comprises a biochemical molecule. According to still further features in the described preferred embodiments the biochemical molecule comprises an amino acid.

The present invention successfully addresses the shortcomings of the presently known configurations by providing device and method for replenishing ionizable material in a field ionization apparatus, method and apparatus for generating a positively charged ion beam by field ionization, and method and system for analyzing substances ejected from a surface of a sample bombarded with a positively charged ion beam.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIGS. 1a-d are cross-sectional views of a device for replenishing ionizable material in a field ionization apparatus, according to various exemplary embodiments of the present invention.

FIG. 2b is an enlarged fragmentary view of sections C marked by solid circles in FIG. 2a.

FIG. 3 is a schematic illustration of the electrical configuration of the apparatus of FIG. 2a;

FIG. 4b is an enlarged fragmentary view of a section D marked by solid circles in FIG. 4a.

FIG. 5 is a schematic illustration of the electrical configuration of the apparatus of FIG. 4a.

DESCRIPTION OF THE PREFERRED EMBODIMENTS

Figure 1A:
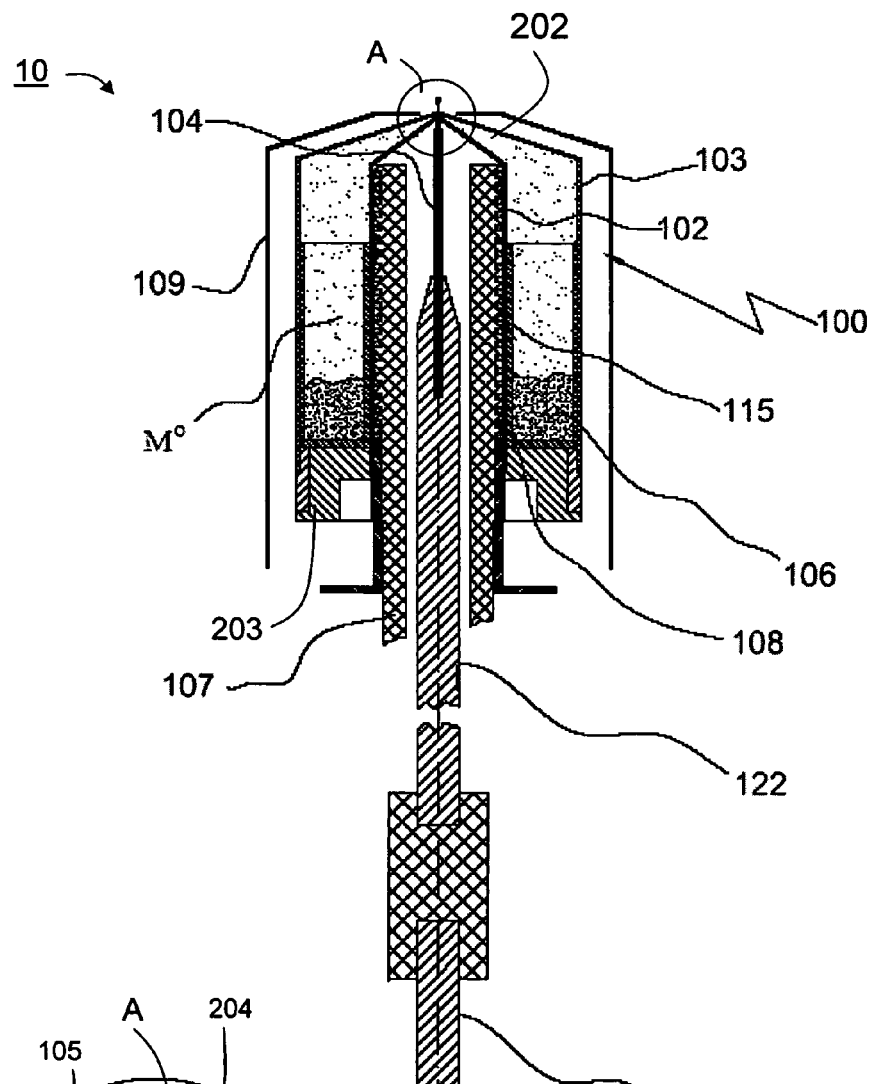

The present embodiments comprise a device, apparatus and method which can be used for generating an ion beam. Specifically, one or more of the present embodiments can be used as a field ionization ion source which to generate positively charged ion beam by utilizing the field ionization phenomenon. The present embodiments can be used in various applications, including, without limitation, semiconductor fabrication, mask production and correction, failure analysis of devices, maskless ion implantation, ion lithography, ion milling, ion etching, deposition, secondary ion mass spectrometry and the like. Thus, the present embodiments also comprise a system and method for analyzing substances ejected from a surface of a sample bombarded with a positively charged ion beam.

The principles and operation of a device, apparatus system and method according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Field ionization is a phenomenon in which electrons are released from an atom or a molecule via potential barrier penetration in the presence of a high electric field. Unlike the escaping over a potential barrier, as with photoionization of atoms or molecules field ionization is purely a quantum mechanical phenomenon, also known as tunneling.

The field ionization phenomenon occurs when the electric field forms a sufficiently narrow potential barrier in the nearest proximity (a few angstroms) to the ionized species. Under the quantum tunneling effect, electrons cross through the potential barrier and are emitted from neutral species resulting in positively ionized species. This is as opposed to thermionic emission, whereby thermal energy within the emission material is sufficient to eject electrons from the material. Electrons ejected via thermionic emission are referred to in the literature as thermal electrons.

The field ionization phenomenon requires very high electric field intensities at the ionization surface, in the range of from about $10^7$ to about $10^8$ volts per centimeter. For formation of such a strong electrical field an ionization surface in the shape of a tip of a needle having a small radius of curvature is used. It is possible to increase the electric field intensity by increasing the magnitude of the voltage applied between the ionization tip and an extraction electrode, and/or by decreasing the radius of curvature of the emitting surface.

In the area of ion beam generation, the field ionization phenomenon has been heretofore employed primarily in LMIS-based systems, whereby the ionization surface of high curvature is formed from a layer of liquid metal coating a tip of a needle. In such systems, the replenishing of material is by electrohydrodynamic motion of the liquid metal along the needle to its tip. However, when it desired to generate ion beams from other, non liquefied forms, electrohydrodynamic flow is not applicable.

While conceiving the present invention it was hypothesized and while reducing the present invention to practice it was realized that the replenishment of material in a field ionization apparatus can be achieved by directing a flux of vaporized ionizable material to a tip of a field ionization electrode structure.

Figure 1B:
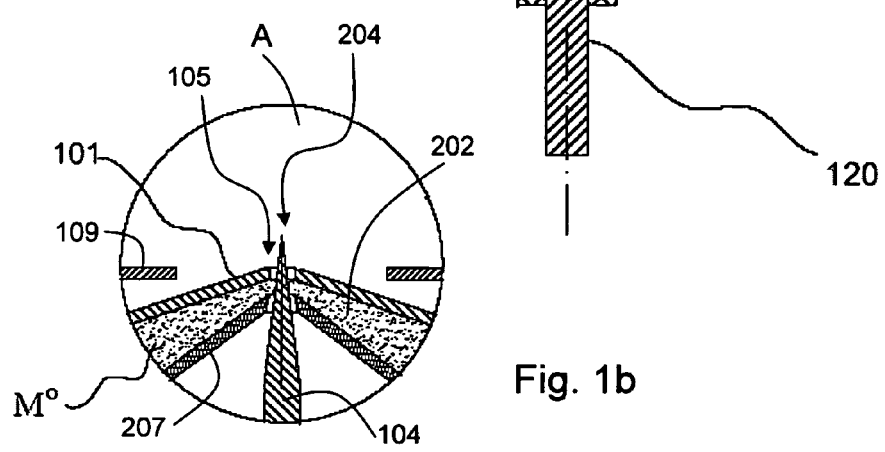

Referring now to the drawings, FIGS. 1*a-d* illustrate a cross-sectional view of a device 10 for replenishing ionizable material in a field ionization apparatus, according to various exemplary embodiments of the present invention. FIGS. 1*b* and 1*d* are, respectively, enlarged fragmentary views of sections A and B marked by solid circles in FIGS. 1*a* and 1*c*. Device 10 comprises a field ionization electrode structure 104 which is typically in the shape of a needle having a tip 204, and a heatable reservoir 100 containing an ionizable material 106. Device 10 preferably operates in vacuum conditions. Reservoir 100 is configured for generating sufficient heat so as to vaporize ionizable material 106. In various exemplary embodiments of the invention ionizable material 106 is substantially dry, for example, material 106 can be in a powder form. Thus, material 106 is preferably characterized in that it is stable in a solid form at room temperature. Additionally, material 106 can be evaporated or sublimed to ionizable vapors.

Material 106 can be organic material or inorganic material, more preferably, but not obligatorily, inorganic material. In various exemplary embodiments of the invention material 106 comprises carbon particles. For example, material 106 can comprises $C_{60}$ molecules or $C_{70}$ molecules or molecules of any other fullerenes with or without substituent groups, e.g., hydrogenated or halogenated fullerenes. Material 106 can also comprises a mixture of fullerenes. Also contemplated are halogen molecules, such as, but not limited to, bromine molecules, iodine molecules, and an aggregate of different molecules. Further contemplated are metalloids (semi-metals) such as, but not limited to, antimony and arsenic clusters. Alternatively or additionally, material 106 can comprise organic compounds such as various polycyclic aromatic hydrocarbon molecules (PAH's), and biochemical molecules such as vaporizable amino acids or their aggregates/multimers (short polypeptides). In any event, reservoir 100 heats material 106 to an elevated temperature so as to provide sufficient concentration of neutral molecules at the tip of field ionization electrode structure 104. Typical temperature values of reservoir 100 are from room temperature to about 1500° C.

As used herein the term "about" refers to ±10%.

In the drawings, the atomic or molecular species of vaporized material is generally denoted by the symbol $M^0$.

The walls 102 and 103 of reservoir 100 preferably comprise a material characterized by high temperature stability, mechanical strength, imperviousness to gas and chemical inertness to ionized material at high temperatures. Walls 103 and 102 can be made, without limitation, from, e.g., stainless steel, tantalum, niobium, molybdenum and the like. In various exemplary embodiments of the present invention, reservoir 100 comprises a ceramic material characterized by a maximum service temperature of about 2000° C.

In various exemplary embodiments of the invention, walls 103 comprise a ceramic material having a melting point above 2200° C. Further, reservoir 100 comprises a ceramic material characterized by chemical inertness, preferably up to the maximum service temperature. Therefore, in various exemplary embodiments of the invention, walls 103 comprise a pure Alumina ceramic. Many other types of high temperature ceramics are also contemplated, such as, but not limited to, alumosilicates, boronitride, fused silica ceramic.

Reservoir 100 is preferably manufactured as an elongated chamber with a generally cylindrical ceramic heater 107 and a heating ribbon 108 wound around the heater. The ceramic body of the heater also provides electrical isolation between ribbon 108 and the metallic components of reservoir 100. The dimensions of the chamber are preferably from about 6 to about 30 mm in diameter and from about 10 to about 100 mm in length. The heating ribbon can comprise any material having the property of resistive heating, including, without limitation, tungsten, molybdenum, rhenium, tantalum and any alloy thereof. In various exemplary embodiments of the invention the heating ribbon is made of rhenium. The elongated chamber can have any shape. For example, in the embodiment illustrated in FIG. 1a, the chamber is defined between two substantially concentric cylindrical walls 102 and 103 assembled, e.g., by means of mounting disk 203. In the embodiment illustrated in FIG. 1c, the chamber is the anterior of a cylindrical wall 103. Other shapes are not excluded from the scope of the present invention.

Reservoir 100 can also comprise a replaceable crucible 115 configured for holding the ionizable material 106 and being sizewise compatible with the elongated chamber of reservoir 100. Replaceable crucible 115 can be detached from device 10 e.g., by the removal of external wall 103 or via one or more ingress ports 225. Replaceable crucible 115 is preferably made of material with high chemical inertness to ionized species at high temperatures. Representative examples of materials for crucible 115 include, but are not limited too, stainless steel, tantalum, niobium, molybdenum, pure Alumina ceramic, alumosilicates, boronitride, fused silica ceramic and the like.

The typical dimensions of field ionization electrode structure 104 are from about 5 mm to about 40 mm in length and from about 0.1 mm to about 2 mm in diameter. The diameter of tip 204 is typically in the micrometric or sub-micrometric scale. Electrode 104 can be made of any conductive material suitable for fabricating a micrometric or a sub-micrometric tip. Representative examples for materials which can be used as field ionization electrode structure 104, include, without limitation, molybdenum, tungsten, rhenium, iridium and diamond and the like. Field ionization electrode structure 104 is preferably kept at thermal isolation from reservoir 100. Alternatively, certain thermal coupling is established between electrode 104 and reservoir 100, for the purpose of activation and/or cleaning, as further detailed herein under. An exemplified illustration an embodiment in which electrode 104 is thermally isolated from reservoir 100 is shown in FIGS. 1a-b, and exemplified illustration an embodiment in which there is a thermal coupling between electrode 104 and reservoir 100 is shown in FIGS. 1c-d. Generally, the preferred thermal configuration (thermal coupling or isolation) depends on the specific combination of material and conditioning of electrode 104.

Device 10 further comprises a channel 202 which is in fluid communication with reservoir 100. More specifically, channel 202 is connected to reservoir 100 such that vapors of material 106 can flow from reservoir 100 to channel 202. In various exemplary embodiments of the invention reservoir 100 and channel 202 are designed and constructed such that when reservoir 100 is heated to an evaporation temperature of ionizable material 106, a flux of vaporized ionizable material $M^0$ is directed along channel 202 to tip 204 of field ionization electrode structure 104. The temperature to which reservoir 100 is heated is preferably selected such as to generate in chamber 202 a vapor pressure $P \geqq P_t$, where $P_t$ is a predetermined pressure threshold. The pressure threshold can have any value from about 0.01 Torr to about 10 Torr. Preferred pressure thresholds are from about 0.05 Torr to about 5 Torr, more preferably from about 0.1 Torr to about 3 Torr, more preferably from about 0.2 Torr to about 2 Torr. Other values for $P_t$ are not excluded from the scope of the present invention.

Channel 202 preferably ends with an orifice 105 through which the vapors of the ionizable material exit in close proximity to tip 204 (e.g., less than 0.1 mm from tip 204). Preferably, but not obligatorily, tip 204 protrudes through orifice 105.

Similarly to reservoir 100, the walls of channel 202 preferably comprise a material characterized by high temperature stability, mechanical strength, imperviousness to gas and chemical inertness at high temperatures. Thus, in various exemplary embodiments of the invention channel 202 and reservoir 100 are made of the same material. The dimensions of channel 202 are preferably from about 0.1 to about 2 mm in diameter and from about 0.1 to about 10 mm in length.

Channel 202 can be embodied in more than one way. For example, in one embodiment, channel 202 is defined between two substantially concentric conical frustums or cylinders. In this embodiment, field ionization electrode structure 104 is disposed within the anterior of the inner conical frustum or inner cylinder, such that proximity between the vapors and the electrode is established only at tip 204, where the vapors exit channel 202. This embodiment is illustrated in FIGS. 1a-b, for the case of conical frustums designated by reference numerals 101 and 207. In another embodiment (see, e.g., FIGS. 1c-d), at least a part of electrode 104 is positioned within channel 202. In the exemplified illustration of FIGS. 1c-d, a part of channel 202 (e.g., orifice 105) is shaped as a capillary and electrode 104 is substantially concentric with the capillary.

According to a preferred embodiment of the present invention device 10 further comprises a mechanism 120 for adjusting the position of electrode 104 within channel 202. Mechanism 120 can comprise a rod 122 having a distal end 123 connected to electrode 104 and a proximal end 124 connected to a drive device 126. In the embodiment illustrated in FIGS. 1c-d, rod 122 is movable in a longitudinal direction along heater 107. In the embodiment illustrated in FIGS. 1c-d, rod 122 is movable in a longitudinal direction within a tube 218 which is preferably aligned coaxially with channel 202. Tube 218 is preferably made of ceramic material, such as the material of reservoir 100. In operation, the adjustment of the position of electrode 104 can control the ion current produced by the field ionization apparatus employing device 10. Device 10 can further comprise one or more shielding members 109 configured for thermal isolating of reservoir 100. Shielding members 109 are preferably maintained at the same (positive) electrical potential of electrode 104.

Figure 4A:
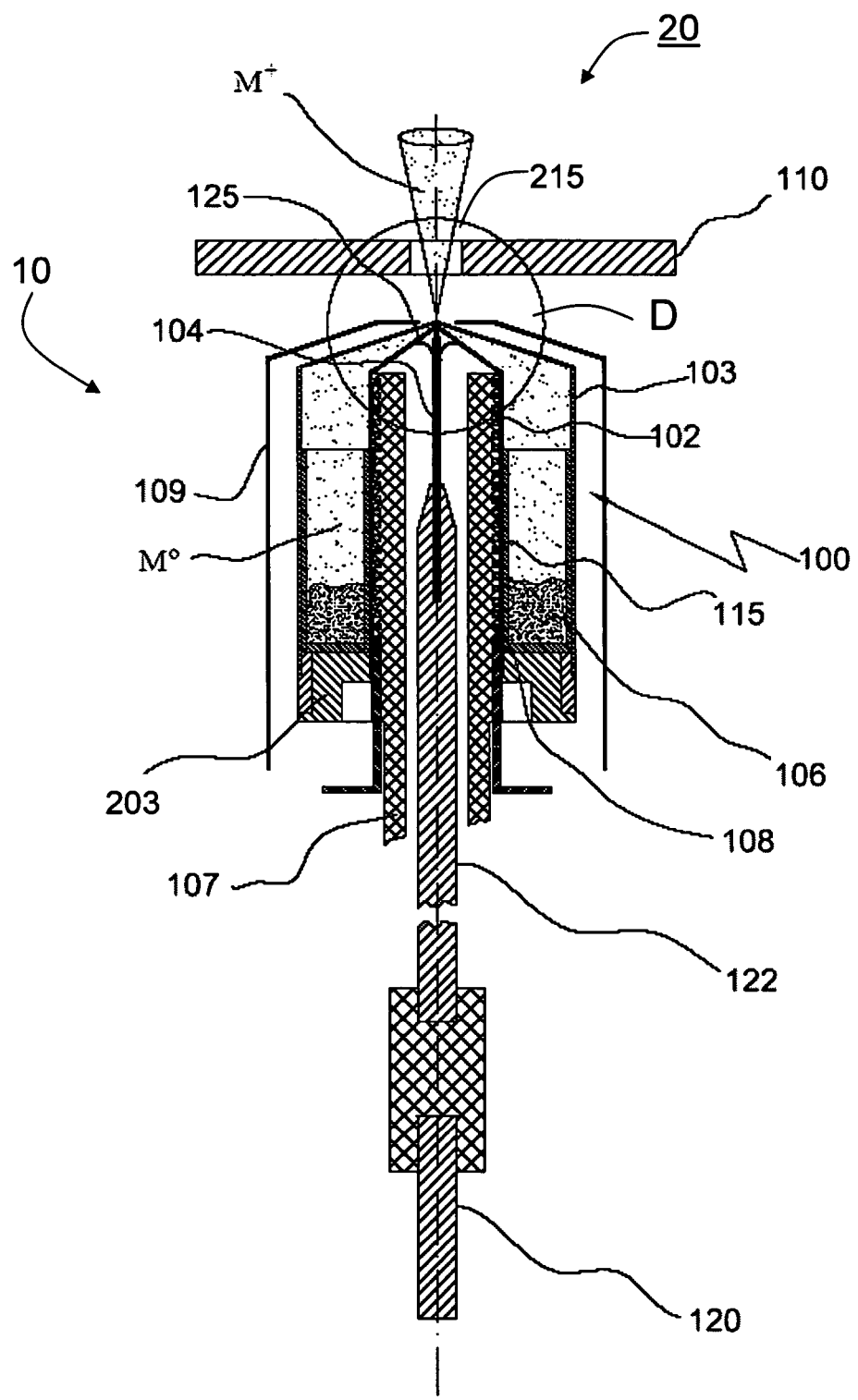
FIGS. 4a-b are schematic illustrations of the apparatus according to another preferred embodiment of the present invention.
Figure 4B:
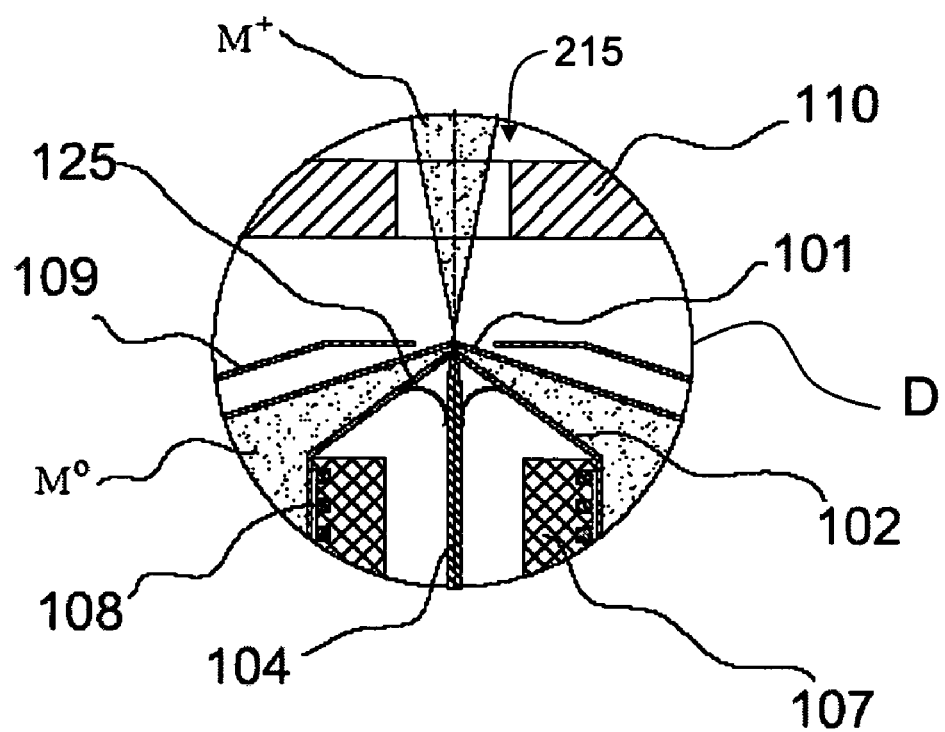
Figure 5:
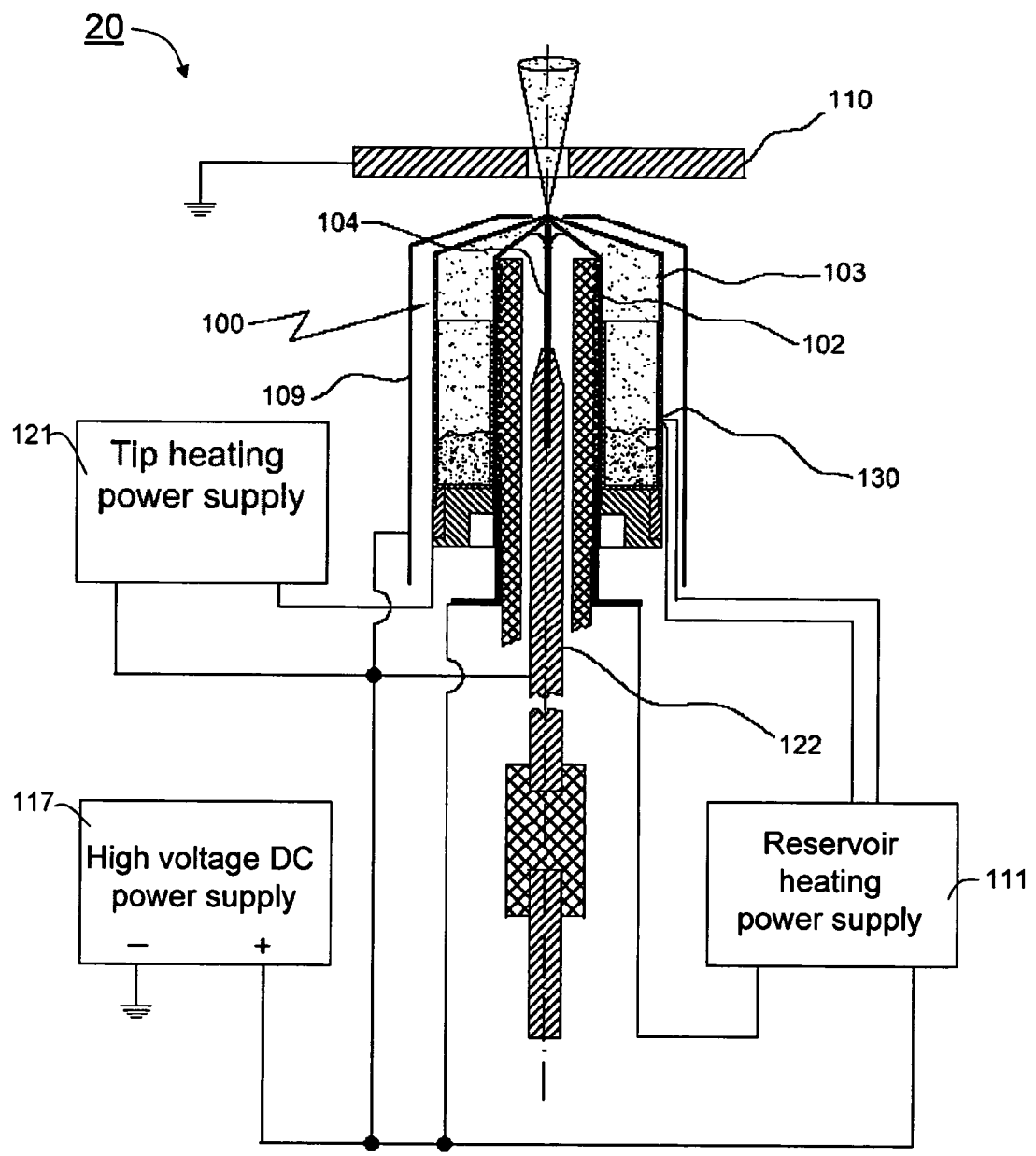
Figure 6:
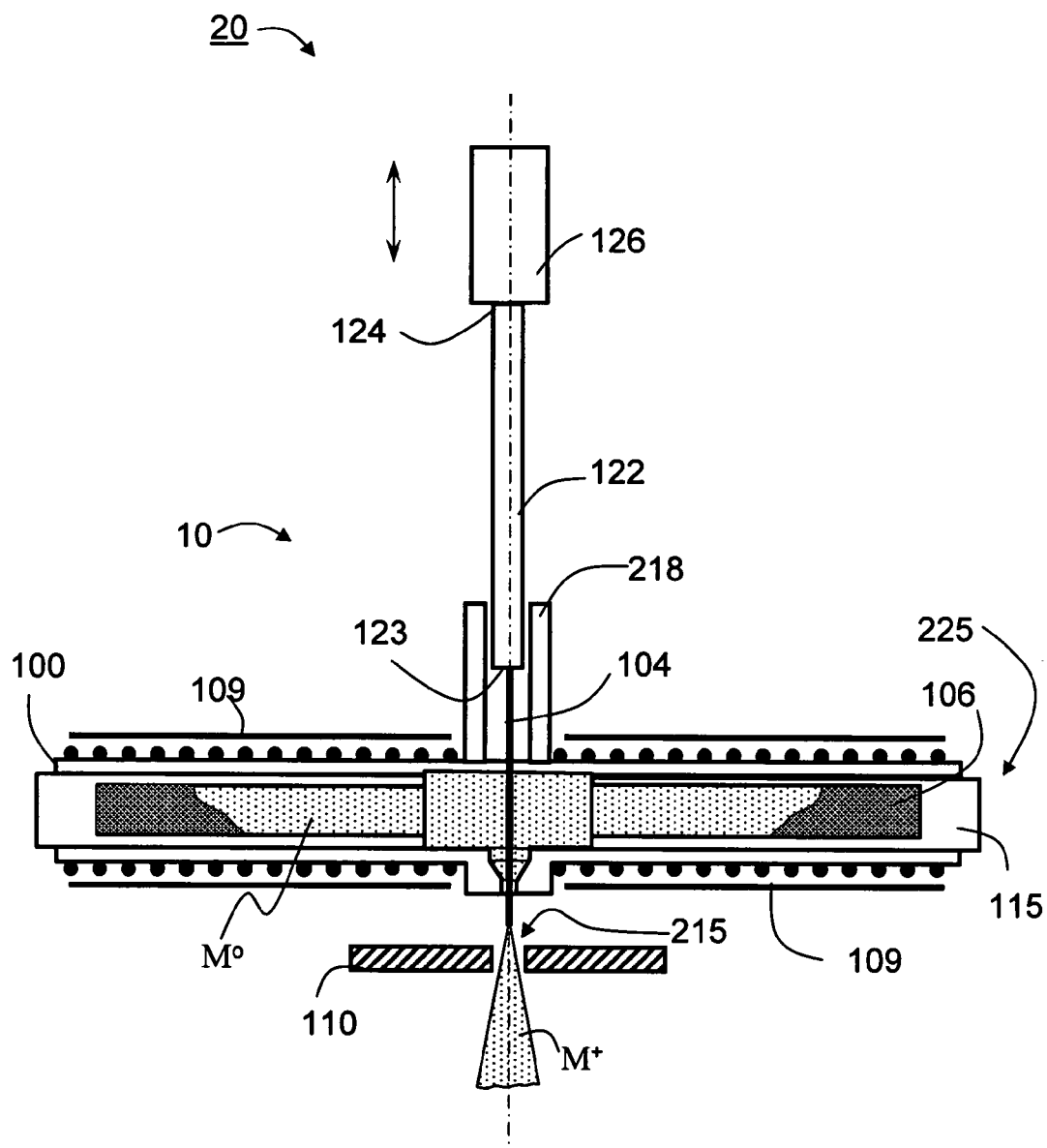
FIG. 6 is a schematic illustration of the apparatus according to another preferred embodiment of the present invention.
Figure 7:
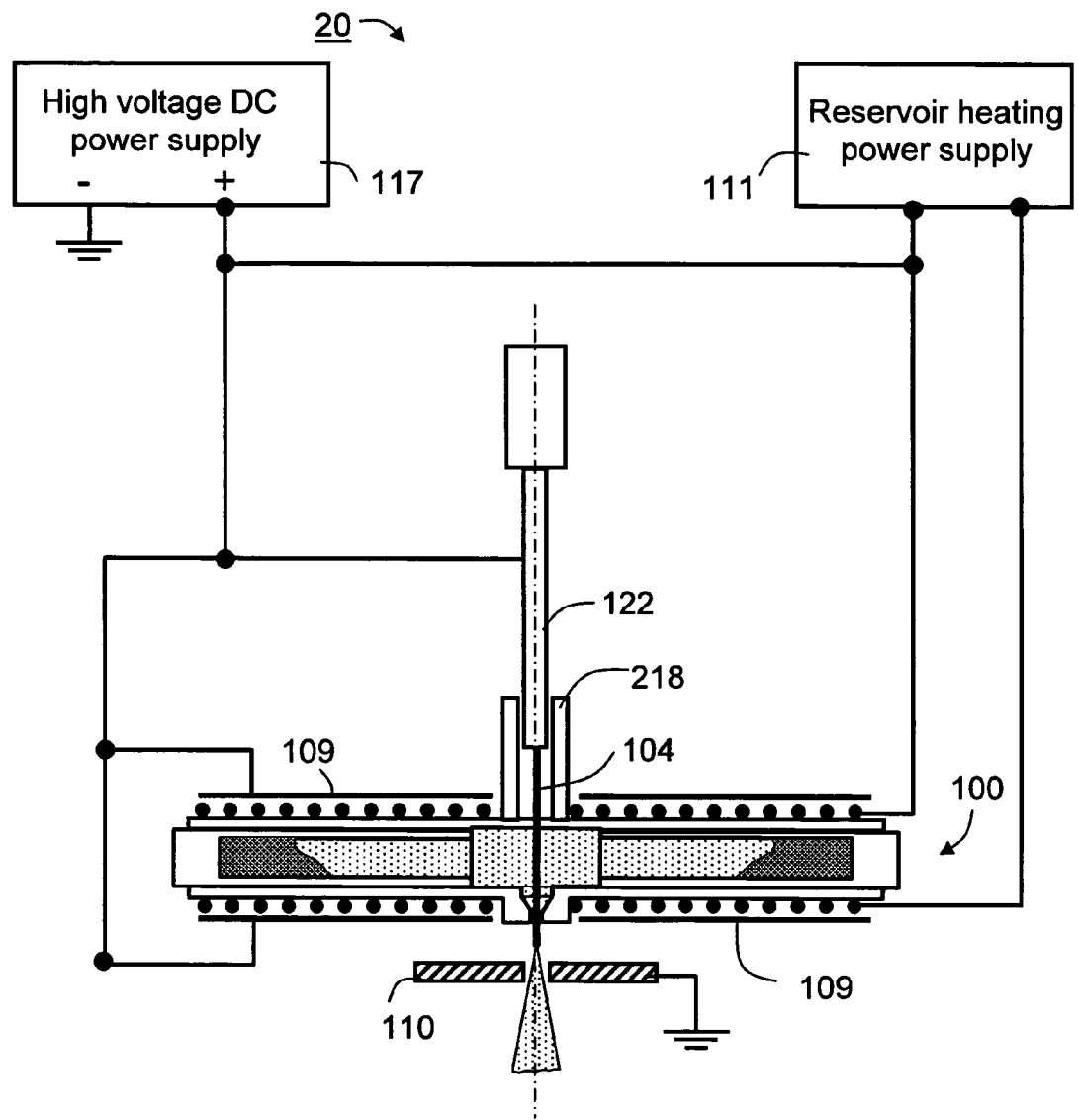
FIG. 7 is a schematic illustration of the electrical configuration of the apparatus of FIG. 6.

Reference is now made to FIGS. 2-7, which are schematic illustrations of an apparatus 20 for generating a positively charged ion beam by field ionization, in various exemplary embodiments of the invention. In its simplest configuration, apparatus 20 comprises device 10 and an extraction electrode 110 positioned in proximity to tip 204. Apparatus 20 preferably operates in vacuum conditions. FIGS. 2-5 are schematic illustrations of apparatus 20 in the preferred embodiments in which proximity between the vapors and electrode 104 is established only at tip 204, and FIGS. 6-7 are schematic illustrations of apparatus 20 in the preferred embodiments in which electrode 104 is positioned within channel substantially concentric therewith.

Extraction electrode 110 is configured to generate at tip 204 electric field of sufficient intensity to ionize the vapors thereby to generate the positively charged ion beam. In various exemplary embodiments of the invention the electric field at tip 204 is at least $10^8$ V/cm, which is sufficient for ionizing the vaporized material $M^o$. The ionized vapors are generally designated by the symbol $M^+$. Extraction electrode 110 preferably comprises a centered orifice 215 which is coaxial with a central axis of electrode 104.

Figure 3:
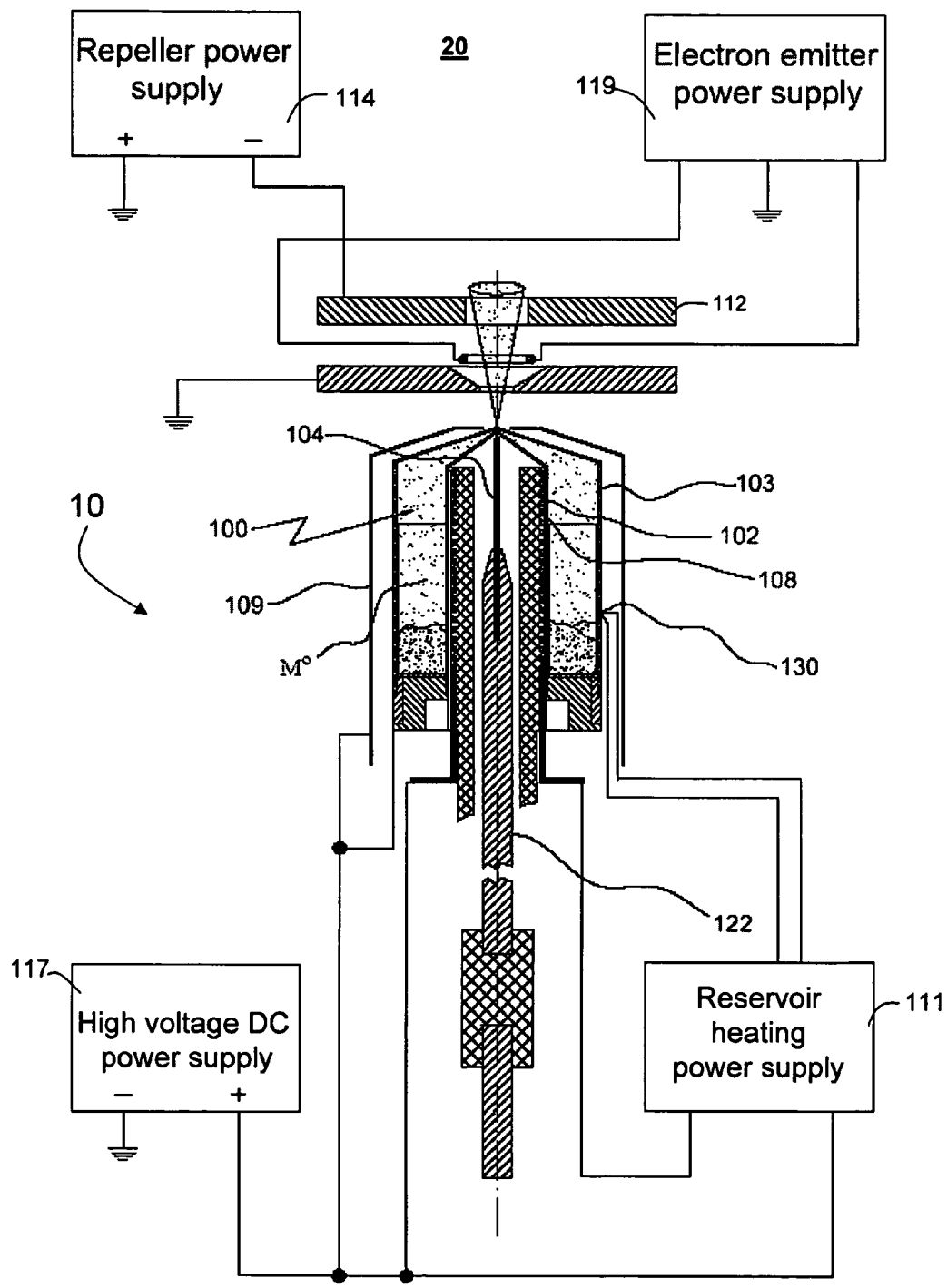

FIGS. 3, 5 and 7 illustrate the electrical configuration of apparatus 20 according to various exemplary embodiments of the present invention. Positive high voltage is preferably supplied by a high voltage DC power supply 117 to electrode 104 as well as shielding member(s) 109. Electrode 110 is preferably grounded. Additional power is supplied to reservoir 100 by heating power supply 111 for generating sufficient heat so as to vaporize material 106. The temperature of reservoir 100 can be controlled and stabilized using a temperature sensor 130, such as, but not limited to, a thermocouple. Sensor 130 preferably contacts the internal or external wall of reservoir 100, and is electrically connected via a feedback loop to power supply 111. In various exemplary embodiments of the invention the control and stabilization of the temperature is characterized by an accuracy of about 1° C. Thus, sensor 130 preferably selected to sense temperature changes of 1° C. or less.

According to a preferred embodiment of the present invention apparatus 20 further comprises a tip heating mechanism for heating tip 104. The heating of tip 104 serves for cleaning, conditioning and/or activating the tip material, hence to provide the tip with better emitting condition. The heating mechanism can heat the tip by resistive heating, electron bombardment and/or thermal conduction.

Figure 2A:
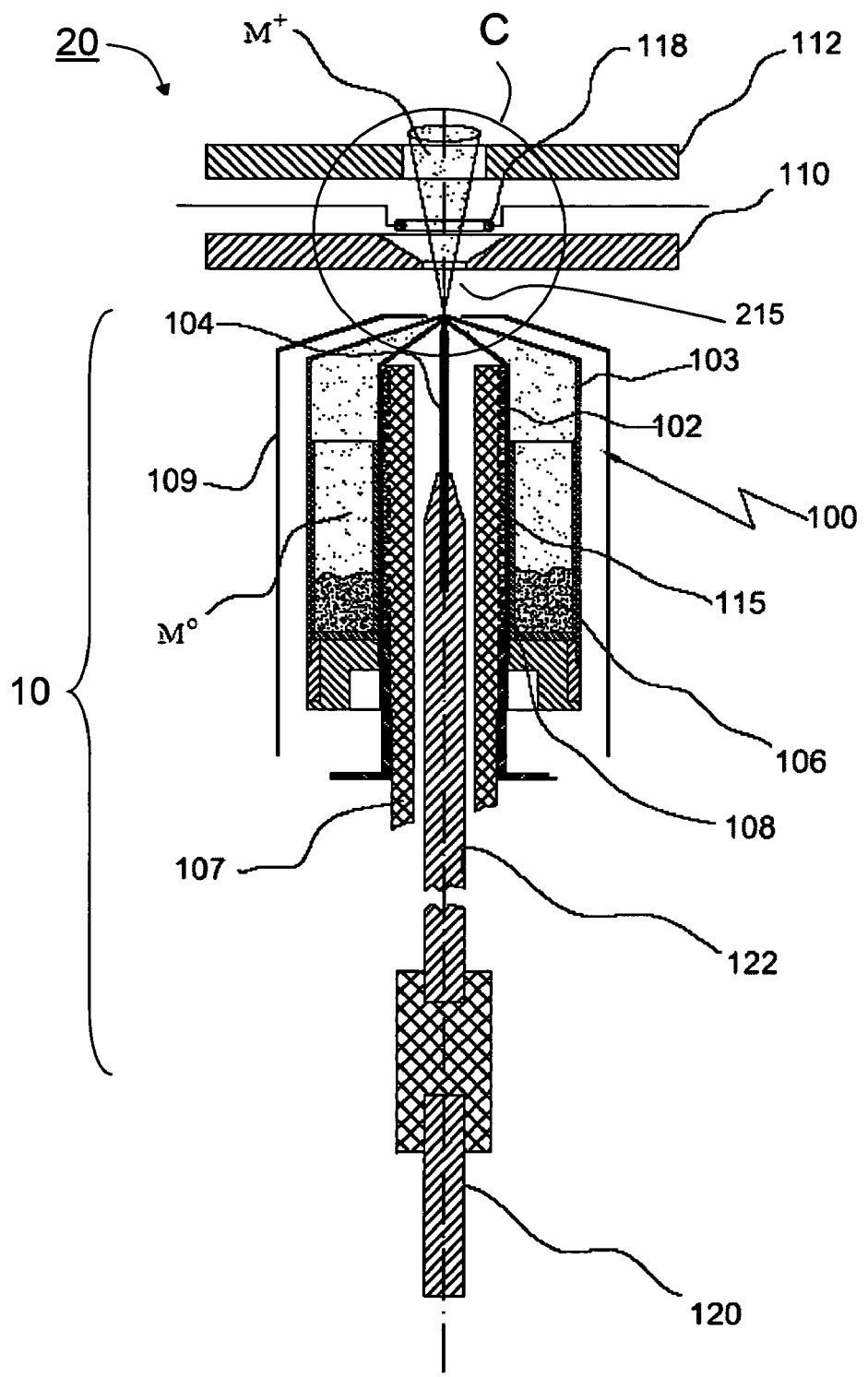
FIGS. 2a-b are schematic illustrations of an apparatus for generating a positively charged ion beam by field ionization, according to a preferred embodiment of the present invention.
Figure 2B:
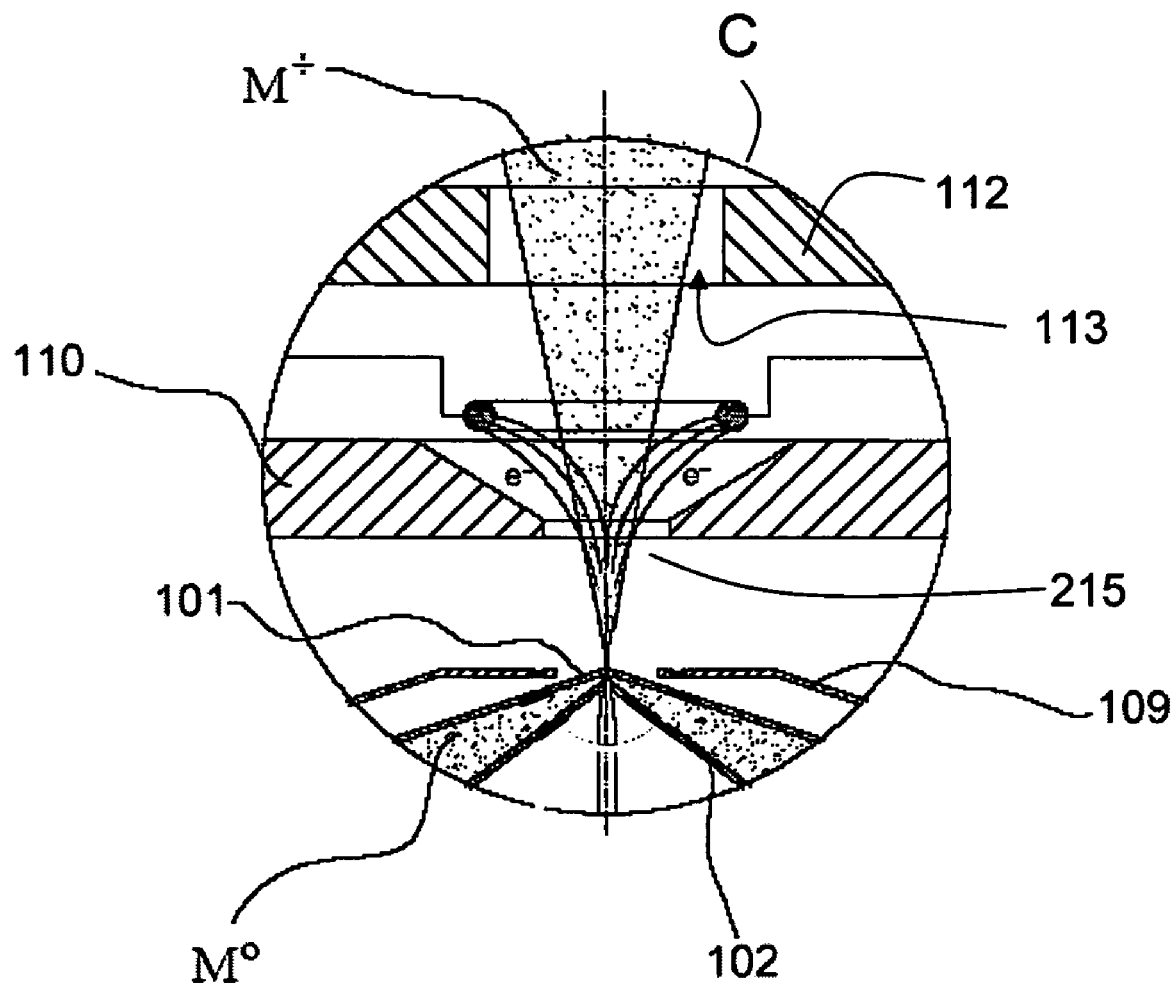

FIGS. 2a-b and 3 schematically illustrate apparatus 10 in a preferred embodiment in which electron bombardment is employed. FIG. 2b is an enlarged fragmentary view of sections C marked by solid circles in FIG. 2a. In this embodiment, the tip heating mechanism comprises a thermal electron emitter 118 and an additional electrode 112 kept at an electrical potential which is lower than the electrical potentials of extraction electrode 110 and field ionization electrode structure 104. For example, electrode 104 can be kept at a positive potential, electrode 110 can be grounded and electrode 112 can be kept at a negative potential. Additional electrode 112 preferably comprises a centered orifice 113 which is also coaxial with the central axis of electrode 104. In operation, emitter 118 emits thermal electrons which are accelerated by the potential difference between electrodes 112, 110 and 104 in the direction of tip 204. Hence, electrode 112 serves as a repeller electrode for the thermal electrons. The accelerated electrons bombard tip 204 thus transferring energy thereto. Consequently, the temperature of tip 204 is increased resulting in the cleaning, conditioning and/or activation thereof. Electrode 112 can also serve as an accelerating electrode which accelerates the ionized atoms or molecules produced by the electric field at tip 204.

With reference to FIG. 3, according to the presently preferred embodiment of the invention, electron emitter 118 is fed by a power supply 119 so as to generate thermionic emission of electrons. Power supply 119 can be a DC or an AC power supply. Electrode 112 can be kept at a small (typically from about 1 V to about 20 V) negative potential relative to the grounded electrode 110, using a power supply 114.

FIGS. 4a-b and 5 schematically illustrate apparatus 20 in a preferred embodiment in which resistive heating is employed. In this embodiment, the tip heating mechanism comprises spring contacts 125 connected to field ionization electrode structure 104 below tip 204. With reference to FIG. 5, spring contacts 125 are preferably fed by power supply 121 via the conductive walls of reservoir 100. The power supply loop can be closed via rod 122. Electrical current thus flows through springs 125, electrode 104 and rod 122 to thereby heat electrode 104 and tip 204.

Figure 8:
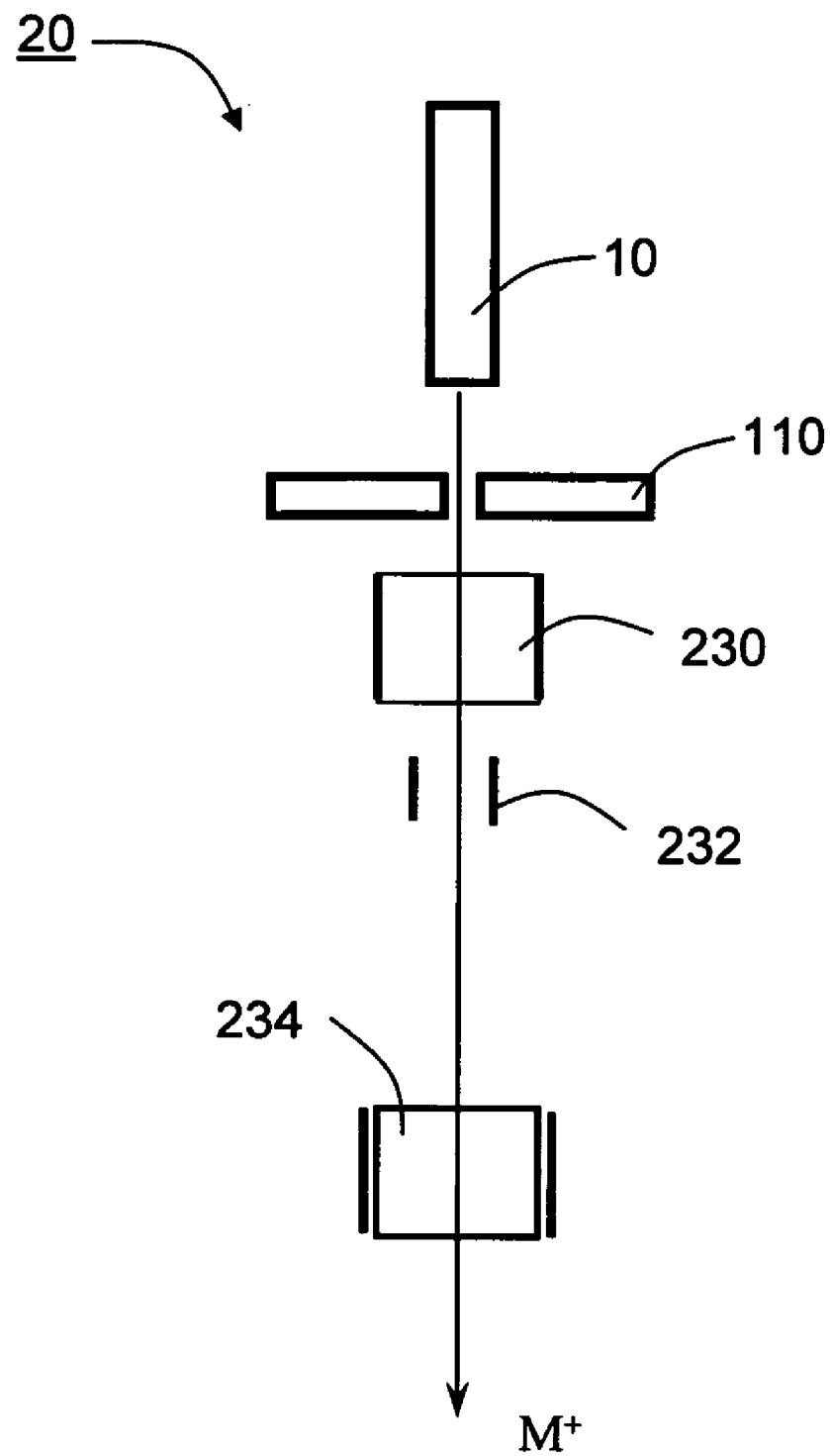
FIG. 8 is a schematic illustration of the apparatus according to another preferred embodiment of the present invention.

Reference is now made to FIG. 8 which is a schematic illustration of apparatus 20, according to a preferred embodiment in which apparatus 20 comprises at least one of: a focusing element 230, a gate electrode 232 and a deflector plate 234. Element 230 serves for focusing the positively charged beam $M^+$, and can be, for example, an Einzel lens or a system of electrostatic lenses, as known in the art. Gate electrode 232 serves for operating apparatus 20 in a pulsed beam mode or for ion beam blanking. In pulse mode operation, gate electrode 232 applies a pulsed electric field at predetermined time intervals such as to control the pulse rate of the positively charged ion beam. Deflector plate 234 can be used, for example, for raster scanning the positively charged ion beam onto a surface.

Figure 9:
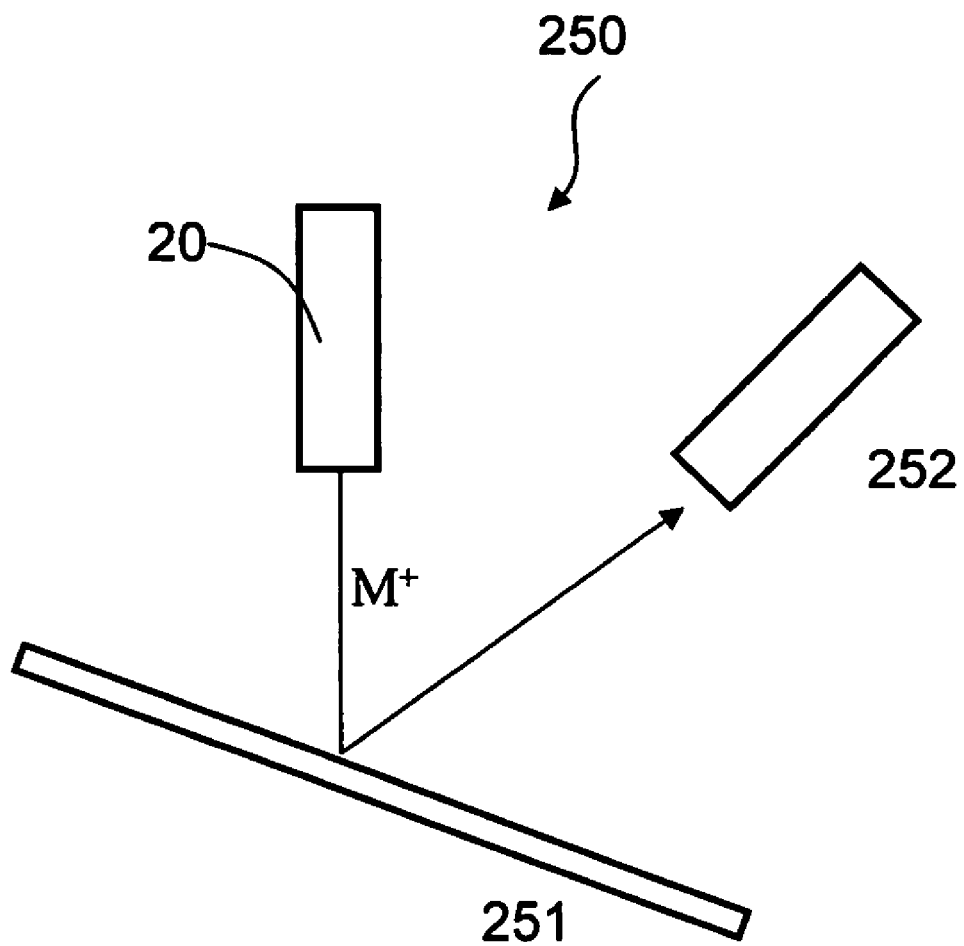
FIG. 9 is a schematic illustration of a system suitable for analyzing substances ejected from a surface of a sample bombarded with a positively charged ion beam, according to a preferred embodiment of the present invention.

FIG. 9 is a schematic illustration of a system 250 suitable for analyzing substances ejected from a surface 251 of a sample bombarded with a positively charged ion beam. System 250 comprises the apparatus 20 a detector 252 for detecting the substances once ejected of the surface. The detector can be any detector known in the art, which is capable of detecting ejected substances. The detector can also comprise an analyzer, such as, but not limited to, energy-mass analyzer and the like.

Figure 10:
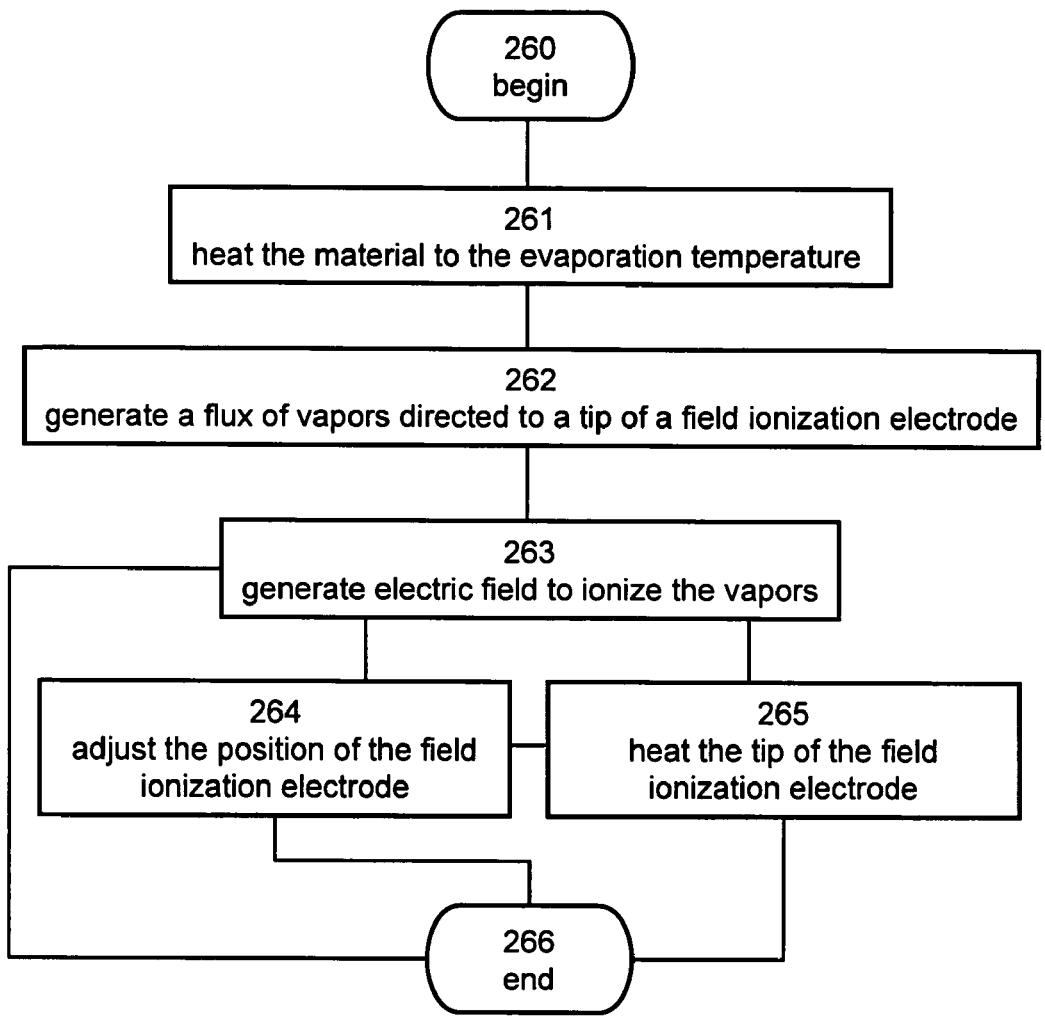
FIG. 10 is a flowchart diagram of a method for generating a positively charged ion beam by field ionization according to various exemplary embodiments of the present invention.

FIG. 10 is a flowchart diagram of a method for generating a positively charged ion beam by field ionization according to various exemplary embodiments of the present invention. The method can be executed, for example, by operating apparatus 20 or system 250. The method can be used for many applications. For example, the method can be used in any application which requires FIB, for surface chemical specific imaging, for lithographing, for surface analysis and the like.

It is to be understood that, unless otherwise defined, the method steps described hereinbelow can be executed either contemporaneously or sequentially in many combinations or orders of execution. Specifically, the ordering of the flowchart diagrams is not to be considered as limiting. For example, two or more method steps, appearing in the following description or in the flowchart diagrams in a particular order, can be executed in a different order (e.g., a reverse order) or substantially contemporaneously. Additionally, several method steps described below are optional and may not be executed.

The method begins at step 260 and continues to step 261 in which the ionizable material is heated to an evaporation temperature of the ionizable material as further detailed hereinabove. The method continues to step 262 in which the vapors are introduced into the channel so as to generate a flux of vaporized ionizable material directed along to the tip of the field ionization electrode structure. The method continues to step 263 in which an electric field is generated so as to ionize the vapors by electron ejection as further detailed hereinabove. In various exemplary embodiments of the invention the method continues to step 264 in which the position of the field ionization electrode structure is adjusted, e.g., by mechanism 120. The position is preferably adjusted so as to increase the ion current produced by the field ionization electrode. More preferably, the position is adjusted until a maximal ion current is achieved. According to a preferred embodiment of the present invention the method continues to step 265 in which the tip of the field ionization electrode is heated for cleaning and/or activation as further detailed hereinabove.

Many additional steps of the method are contemplated, depending on the application for which the method is employed. In various exemplary embodiments of the present invention, the produced beam is used for any application in the following non-exhaustive list: atomic physics, molecular physics, plasma physics, thin film deposition, surface etching, ion implantation, submicron lithography, nano-electromechanical system construction, nanophotonic system construction, new material synthesis, and electric propulsion devices, such as, but not limited to, ion engines for microsatellites. In various exemplary embodiments of the present invention, either the positively charged ion beam is used for any application in the following non-exhaustive list: surface chemistry and catalysis, organic chemistry, biology, pharmacology and biotechnology. For example, when the method is used for surface analysis, the method detects dejected substances and analyzes them as known in the art. When the method is used for lithography, the method continues to various lithography steps, etc.

The method ends at step 266.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A device for replenishing ionizable material in a field ionization apparatus, the device comprising:
 a heatable reservoir containing the ionizable material, wherein said ionizable material selected from the group consisting of fullerene, halogen, organic material and a biochemical molecule,
 a first heating mechanism configured for heating said reservoir,
 a field ionization electrode structure having a tip,
 a tip heating mechanism configured for heating said tip and being separated from said first heating mechanism, and
 a channel being in fluid communication with said heatable reservoir,
 wherein said heatable reservoir and said channel are designed and constructed such that when said heatable reservoir is heated to an evaporation temperature of the ionizable material, a flux of vaporized ionizable material is directed along said channel to said tip.

2. Apparatus for generating a positively charged ion beam by field ionization, comprising the device of claim 1 and an extraction electrode positioned in proximity to said tip and configured to generate at said tip electric field of sufficient intensity to ionize said vapors to generate the positively charged ion beam.

3. A system for analyzing substances ejected from a surface of a sample bombarded with a positively charged ion beam, comprising, the apparatus of claim 2 and a detector for detecting the substances once ejected of the surface.

4. The apparatus of claim 2, wherein said extraction electrode comprises a centered orifice being coaxial with a central axis of said field ionization electrode structure.

5. The apparatus of claim 2, wherein the apparatus further comprises an additional electrode kept at an electrical potential which is lower than the electrical potential of said extraction electrode.

6. The apparatus of claim 2, wherein the apparatus further comprises at least one focusing element designed and configured for focusing the positively charged ion beam.

7. The apparatus of claim 2, wherein the apparatus further comprises at least one gate electrode for pulsed beam mode operation.

8. The apparatus of claim 2, wherein the apparatus further comprises deflector plates for raster scanning the positively charged ion beam onto a surface.

9. The device of claim 1, wherein the device further comprises a mechanism for adjusting the position of said field ionization electrode structure within said channel.

10. The device of claim 9, wherein said mechanism comprises a rod having an inner end connected to said field ionization electrode structure and an outer end connected to a drive device.

11. The device of claim 1, wherein said heatable reservoir comprises an elongated chamber and a heating ribbon wound around said elongated chamber.

12. The device of claim 1, wherein said heatable reservoir is made at least in part of a material characterized by chemical inertness up to a maximum service temperature of said heatable reservoir.

13. The device of claim 1, wherein the device further comprises at least one shielding member configured for thermal isolation of the reservoir and said field ionization electrode structure.

14. The device of claim 1, wherein the device further comprises at least one ingress port connected to said heatable reservoir and configured for feeding of said heatable reservoir with ionizable material.

15. The apparatus of claim 1, wherein said tip heating mechanism is operable to heat said tip by resistive heating.

16. The apparatus of claim 1, wherein said tip heating mechanism is operable to heat said tip by electron bombardment.

17. The apparatus of claim 16, wherein said tip heating mechanism comprises a thermal electron emitter configured for emitting thermal electrons, and an additional electrode kept at an electrical potential which is lower than the electrical potentials of said extraction electrode and said tip such as to accelerate said thermal electrons in the direction of said tip.

18. The device of claim 1, wherein at least a part of said field ionization electrode structure is positioned within said channel.

19. The device of claim 1, wherein said channel comprises an orifice and said tip protrudes through said orifice.

20. The device of claim 1, wherein at least a part of said channel is shaped as a capillary and at least a part said field ionization electrode structure is substantially concentric with said capillary.

21. The device of claim 20, wherein said channel is defined between two substantially concentric conical frustums.

22. The device of claim 20, wherein said channel is defined between two substantially concentric cylinders.

23. The device of claim 1, wherein said channel is made at least in part of a ceramic material characterized by chemical inertness up to a maximum service temperature of said channel.

24. The device of claim 1, wherein said ionizable material is a sublimable or vaporizable molecular material.

25. The device of claim 1, wherein said ionizable material comprises at least one type of molecules selected from the group consisting of $C_{60}$ and $C_{70}$.

26. The device of claim 1, wherein said field ionization electrode structure is at thermal isolation from said reservoir.

27. The device of claim 1, further comprising a first power supply for heating said tip, and a second power supply for heating said reservoir.

28. The device of claim 1, wherein said channel is shaped as a frustum tapered towards said tip and has an orifice in proximity to said tip for allowing said flux of vaporized ionizable material to exit from said channel and be directed to said tip.

29. A method of replenishing ionizable material in a field ionization apparatus, the method comprising:
heating the ionizable material to an evaporation temperature of said ionizable material, wherein said ionizable material is selected from the group consisting of fullerene, halogen, organic material and a biochemical molecule,
heating a tip of a field ionization electrode structure, separately from said heating of said ionizable material, and
introducing vapors of said ionizable material into a channel so as to generate a flux of vaporized ionizable material directed along said channel to said tip.

30. A method of generating a positively charged ion beam by field ionization, comprising:
executing the method of claim 29 so as to replenish the ionizable material near the tip of the field ionization electrode structure and
generating at said tip an electric field of sufficient intensity to ionize said vapors generating the positively charged ion beam.

31. A method of analyzing substances ejected from a surface of a sample bombarded with a positively charged ion beam, comprising, executing the method of claim 30 so as to cause ejection of substances from the surface of the sample, detecting the ejected substances, and analyzing the ejected substances.

32. The method of claim 29, further comprising adjusting the position of said field ionization electrode structure.

33. A device for replenishing ionizable material in a field ionization apparatus, the device comprising:
a heatable reservoir containing the ionizable material,
a field ionization electrode structure, and
a channel, in fluid communication with said heatable reservoir, said channel being defined between two substantially concentric frustums tapered towards a tip of said electrode structure and having an orifice in proximity to said tip,
wherein said heatable reservoir and said channel are designed and constructed such that when said heatable reservoir is heated to an evaporation temperature of the ionizable material, a flux of vaporized ionizable material is directed along said channel to said tip.

* * * * *